United States Patent
Li

(10) Patent No.: US 11,574,965 B2
(45) Date of Patent: Feb. 7, 2023

(54) PHOTODIODE FOR REALIZING AUTOMATIC ADJUSTMENT OF DISPLAY BRIGHTNESS, AND DISPLAY SUBSTRATE AND DISPLAY DEVICE COMPRISING SAID PHOTODIODE

(71) Applicant: BOE TECHNOLOGY GROUP CO., LTD., Beijing (CN)

(72) Inventor: Mei Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 60 days.

(21) Appl. No.: 17/005,701

(22) Filed: Aug. 28, 2020

(65) Prior Publication Data
US 2021/0183967 A1 Jun. 17, 2021

(30) Foreign Application Priority Data
Dec. 13, 2019 (CN) .......................... 201911285998.3

(51) Int. Cl.
H01L 27/32 (2006.01)
H01L 27/12 (2006.01)
(Continued)

(52) U.S. Cl.
CPC ...... H01L 27/3227 (2013.01); H01L 27/1259 (2013.01); H01L 27/1443 (2013.01);
(Continued)

(58) Field of Classification Search
CPC .............. H01L 27/1259; H01L 27/1443; H01L 27/14603; H01L 27/3227; H01L 27/3269;
(Continued)

(56) References Cited

U.S. PATENT DOCUMENTS 7,453,132 B1* 11/2008 Gunn, III ............ H01L 31/0232
257/448
2011/0031529 A1* 2/2011 Miura ................ H01L 21/02381
257/E31.037
(Continued)

FOREIGN PATENT DOCUMENTS

| CN | 101447523 A | 6/2009 |
| CN | 103597600 A | 2/2014 |
| CN | 106847958 A | 6/2017 |

OTHER PUBLICATIONS

China Patent Office, First Office Action Dec. 17, 2020 issued in corresponding Chinese Application No. 201911285998.3.

*Primary Examiner* — Herve-Louis Y Assouman
*Assistant Examiner* — Christopher M Roland
(74) *Attorney, Agent, or Firm* — Houtteman Law LLC

(57) ABSTRACT

The present disclosure provides a photodiode, a display substrate, and manufacturing methods thereof, and a display device. The method for manufacturing the photodiode includes: forming a semiconductor material layer on a base substrate in a non-display region of a display substrate, the semiconductor material layer including a first contact area, a second contact area, and a semiconductor area sandwiched therebetween; processing the first contact area of the semiconductor material layer to form a first contact electrode; processing portions of the semiconductor material layer and the second contact area away from the base substrate in the semiconductor area, to form a first semiconductor layer and a second semiconductor layer stacked, the second semiconductor layer being located on a side of the first semiconductor layer away from the base substrate; and processing the second semiconductor layer in the second contact area to form a second contact electrode.

6 Claims, 4 Drawing Sheets

(51) Int. Cl.
*H01L 31/0224* (2006.01)
*H01L 27/146* (2006.01)
*H01L 31/14* (2006.01)
*H01L 31/16* (2006.01)
*H01L 31/18* (2006.01)
*H01L 27/144* (2006.01)
*H01L 31/02* (2006.01)

(52) U.S. Cl.
CPC .... *H01L 27/14603* (2013.01); *H01L 27/3269* (2013.01); *H01L 31/02005* (2013.01); *H01L 31/022408* (2013.01); *H01L 31/14* (2013.01); *H01L 31/16* (2013.01); *H01L 31/18* (2013.01)

(58) Field of Classification Search
CPC ....... H01L 31/02005; H01L 31/022408; H01L 31/14; H01L 31/16; H01L 31/18
See application file for complete search history.

(56) References Cited

U.S. PATENT DOCUMENTS

| | | | |
|---|---|---|---|
| 2011/0198608 A1* | 8/2011 | Yamanaka | H01L 29/861 257/E31.043 |
| 2015/0214387 A1 | 7/2015 | Kang et al. | |
| 2016/0141329 A1* | 5/2016 | Cheng | H01L 31/02161 257/458 |
| 2018/0090631 A1* | 3/2018 | Chen | H01L 31/02005 |

* cited by examiner

PHOTODIODE FOR REALIZING AUTOMATIC ADJUSTMENT OF DISPLAY BRIGHTNESS, AND DISPLAY SUBSTRATE AND DISPLAY DEVICE COMPRISING SAID PHOTODIODE

CROSS-REFERENCE TO RELATED APPLICATIONS

The present application claims the priority of Chinese Patent Application No. 201911285998.3 filed with the SIPO on Dec. 13, 2019, the entire contents of which are incorporated herein by reference.

TECHNICAL FIELD

The present disclosure relates to the field of display technology, and in particular, to a photodiode and a manufacturing method thereof, a display substrate and a manufacturing method thereof, and a display device.

BACKGROUND

With the continuous development of technology, smart devices have gradually entered people's life. For a smart device having a display function, if the display screen is kept in a high-brightness state for a long time, not only the power consumption will be increased, but also the display effect will be influenced and the visual experience of users will be degraded.

SUMMARY

In one aspect, a method for manufacturing a photodiode is provided, and the method includes: forming a semiconductor material layer on a base substrate in a non-display region of a display substrate, the semiconductor material layer including a first contact area, a second contact area, and a semiconductor area sandwiched therebetween; processing the semiconductor material layer in the first contact area to form a first contact electrode; processing portions, which are away from the base substrate, of the semiconductor material layer in the semiconductor area and the second contact area, so as to form a first semiconductor layer and a second semiconductor layer that are stacked, the second semiconductor layer being located on a side of the first semiconductor layer away from the base substrate; and processing the second semiconductor layer in the second contact area to form a second contact electrode.

In one embodiment, the step of processing the semiconductor material layer in the first contact area to form the first contact electrode includes: implanting first ions of a first concentration into the semiconductor material layer in the first contact area to form the heavily-doped first contact electrode, with the first ions and a semiconductor material layer having a same polarity.

In one embodiment, the first ions include: Boron ions or Gallium ions.

In one embodiment, the step of processing portions, which are away from the base substrate, of the semiconductor material layer in the semiconductor area and the second contact area, so as to form a first semiconductor layer and a second semiconductor layer that are stacked includes: implanting second ions of a second concentration into the portion of the semiconductor material layer in the semiconductor area and the portion of the semiconductor material layer in the second contact area, with the two portions being away from the base substrate, to form the first semiconductor layer and the second semiconductor layer that are stacked, with the second ions and the semiconductor material layer having opposite polarities.

In one embodiment, the step of processing the second semiconductor layer in the second contact area to form the second contact electrode includes: implanting the second ions of a third concentration into the second semiconductor layer in the second contact area to form the heavily-doped second contact electrode.

In one embodiment, the second ions include Phosphorus ions or Arsenic ions.

In one embodiment, the manufacturing method further includes: forming a first interlayer insulating layer and a second interlayer insulating layer on the first contact electrode, the second semiconductor layer and the second contact electrode; forming a first via that exposes an upper surface of the first contact electrode and a second via that exposes an upper surface of the second contact electrode in the interlayer insulating layers; and forming a first connection electrode, which is electrically connected to the first contact electrode, in the first via, and forming a second connection electrode, which is electrically connected to the second contact electrode, in the second via.

In one embodiment, the step of forming the semiconductor material layer on the base substrate includes: forming the semiconductor material layer on the base substrate by using a semiconductor material through a sputtering process.

In another aspect, a method for manufacturing a display substrate including a display region and a non-display region, is provided, and the method includes: performing the above method for manufacturing a photodiode in the non-display region; and forming a thin film transistor of a sub-pixel in the display region. The step of forming the thin film transistor includes: forming an active layer of the thin film transistor on the base substrate in the display region; forming the first interlayer insulating layer on a side of the active layer away from the base substrate; forming a gate electrode on a side of the first interlayer insulating layer away from the base substrate; forming the second interlayer insulating layer on a side of the gate electrode away from the base substrate; and forming a source electrode and a drain electrode in the first and the second interlayer insulating layers, such that the source electrode and the drain electrode are electrically connected to two ends of the active layer respectively.

In another aspect, a photodiode is provided, and the photodiode includes: a first semiconductor layer located on a base substrate in a non-display region of a display substrate; a first contact electrode located at one end of the first semiconductor layer; a second semiconductor layer located on a side of the first semiconductor layer away from the base substrate; and a second contact electrode located on the side of the first semiconductor layer away from the base substrate and at the other end of the second semiconductor layer away from the first contact electrode.

In one embodiment, the photodiode further includes: a first interlayer insulating layer located on a side of the first contact electrode, the second contact electrode and the second semiconductor layer away from the base substrate; a second interlayer insulating layer located on a side of the first interlayer insulating layer away from the base substrate; and a first connection electrode and a second connection electrode that penetrate through the first and second interlayer insulating layers, and are connected to the first and second contact electrodes respectively.

In one embodiment, an orthographic projection of the first contact electrode on the base substrate is in direct contact with and does not overlap an orthographic projection of the first semiconductor layer on the base substrate, and is in direct contact with and does not overlap an orthographic projection of the second semiconductor layer on the base substrate. A height of the first contact electrode along a direction perpendicular to the base substrate is equal to a sum of a height of the first semiconductor layer along the direction perpendicular to the base substrate and a height of the second semiconductor layer along the direction perpendicular to the base substrate.

In one embodiment, an orthographic projection of the second contact electrode on the base substrate overlaps the orthographic projection of the first semiconductor layer on the base substrate, and is in direct contact with and does not overlap the orthographic projection of the second semiconductor layer on the base substrate. A height of the second contact electrode along the direction perpendicular to the base substrate is equal to a height of the second semiconductor layer along the direction perpendicular to the base substrate.

In one embodiment, a thickness of the first semiconductor layer is equal to a thickness of the second semiconductor layer.

In another aspect, a display substrate is provided, and the display substrate includes: the above photodiode; and a thin film transistor of a sub-pixel located in a display region of the display substrate. The thin film transistor includes: an active layer located on a base substrate in the display region; the first interlayer insulating layer located on a side of the active layer away from the base substrate; a gate electrode located on a side of the first interlayer insulating layer away from the base substrate; the second interlayer insulating layer located on a side of the gate electrode away from the base substrate; and a source electrode and a drain electrode that penetrate through the first and second interlayer insulating layers, and are electrically connected to two ends of the active layer respectively.

In still another aspect, a display device is provided, and includes: the above display substrate; and a driving chip configured to input a brightness adjustment signal to the sub-pixel according to an electrical signal from the photodiode in the display substrate.

DETAILED DESCRIPTION

In order to enable those skilled in the art to better understand the technical solutions of the present disclosure, the present disclosure is further described in detail below with reference to the accompanying drawings and specific embodiments.

In order to realize automatic adjustment of display brightness of a display screen, a light sensor is usually externally attached to a smart terminal in the related art. The light sensor mainly includes a light projector and a light receiver. The light projector can acquire the brightness of ambient light and transmit a light signal to the light receiver, and the light receiver can convert the light signal into an electric signal. A driving chip in the smart terminal can generate a control signal according to the electric signal, so as to automatically adjust the display brightness of the display screen.

In the related art, due to the complex structure of the light sensor and the limitation of the manufacturing process of the light sensor, the light sensor is usually externally attached to the smart terminal and occupies of a certain space, thereby easily influencing the display effect of the display screen, and making it hard to achieve full-screen display.

As stated herein, a sub-pixel area in a display region refers to a light-emission area of a sub-pixel, for example, an area corresponding to a pixel electrode in a liquid crystal display, or an area corresponding to an organic light emitting layer in a light emitting diode layer. Alternatively, one pixel may include a plurality of independent light-emission areas corresponding to a plurality of sub-pixels of the pixel. Optionally, a sub-pixel is a red sub-pixel, a green sub-pixel, a blue sub-pixel, or a white sub-pixel. A non-display region where no light emitting device is disposed is located at the periphery of the display region.

Figure 1:
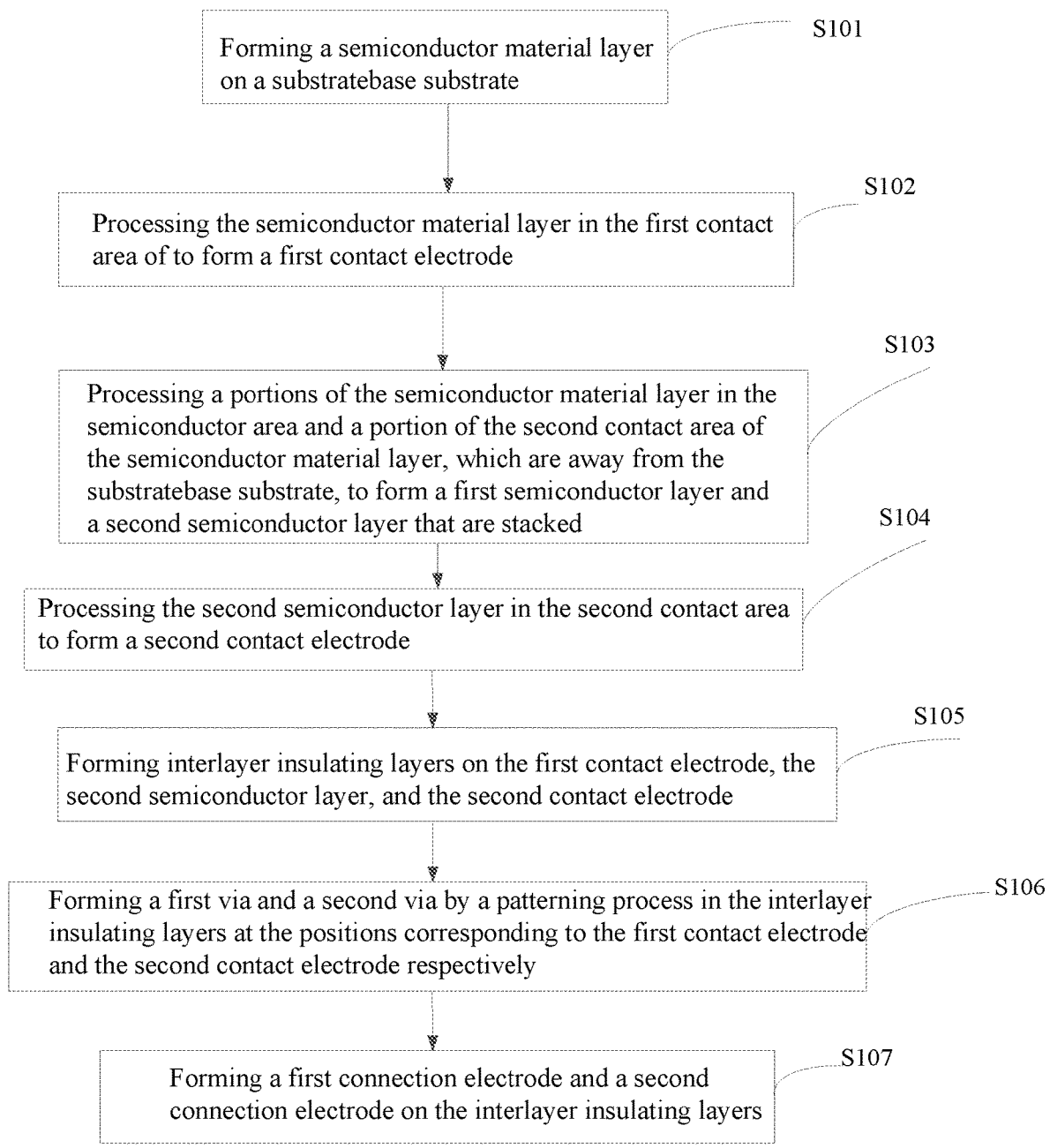
FIG. 1 is a flowchart illustrating a method for manufacturing a photodiode according to the embodiments of the present disclosure.

FIG. 1 is a flowchart illustrating a method for manufacturing a photodiode according to the embodiments of the present disclosure. As shown in FIG. 1, the method for manufacturing a photodiode includes steps S101 to S107.

At S101, a semiconductor material layer is formed on a base substrate.

Figure 2:
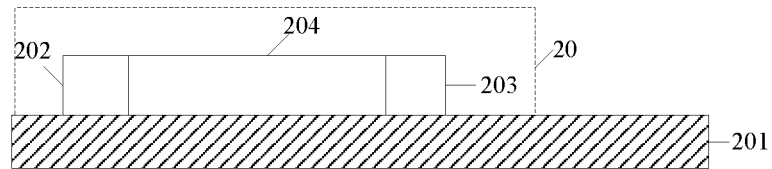
FIGS. 2 to 8 are schematic diagrams illustrating a method for manufacturing a photodiode according to the embodiments of the present disclosure.

As shown in FIG. 2, a semiconductor material layer 20 may be formed on a base substrate 201 by using a semiconductor material. The semiconductor material layer 20 includes a first contact area 202, a second contact area 203, and a semiconductor area 204 sandwiched between the first contact area 202 and the second contact area 203. It should be understood that the semiconductor material may be a P-type semiconductor or an N-type semiconductor. The P-type semiconductor is taken as an example of the semiconductor material in the embodiments of the present disclosure.

At S102, the semiconductor material layer in the first contact area 202 is processed to form a first contact electrode 2021.

Figure 3:
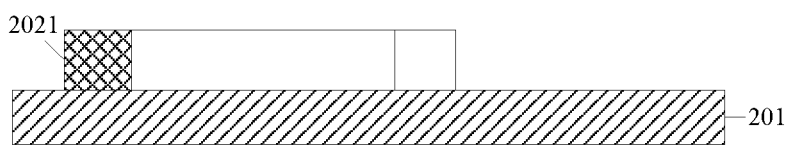

As shown in FIG. 3, a conductorization process may be performed on the first contact area 202 at one end of the semiconductor material layer 20, so as to form the first contact electrode 2021. The first contact electrode 2021 may form ohmic contacts with other conductor materials, and serve as one electrode of the photodiode to be connected to other circuits in a display substrate.

At S103, portions, which are away from the base substrate 201, of the semiconductor material layer in the semiconductor area 204 and the second contact area 203 are processed to form a first semiconductor layer 2041 and a second semiconductor layer 2042 which are stacked together.

Figure 4:
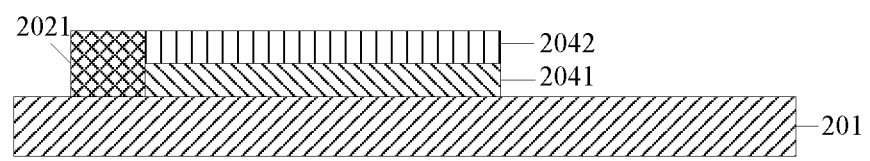

As shown in FIG. 4, the portions, which are away from the base substrate 201, of the semiconductor material layer 20 in the semiconductor area 204 and the second contact area 203 may be processed. A thickness of the portions may be half of a thickness of the semiconductor material layer 20, or may be reasonably controlled according to actual needs. The polarity of the upper portions of the semiconductor material layer 20 in the semiconductor area 204 and the second contact area 203 are opposite to the polarity of the lower portions of the semiconductor material layer 20 in the semiconductor area 204 and the second contact area 203, so as to form the first semiconductor layer 2041 and the second semiconductor layer 2042 which have opposite polarities. In the absence of light irradiation, the photodiode has infinite resistance. When the photodiode is irradiated with light, electron-hole pairs are generated between the first semiconductor layer 2041 and the second semiconductor layer 2042; due to diffusion and a built-in electric field, the electrons and the holes are transported to the second semiconductor layer 2042 and the first semiconductor layer 2041 respectively to generate a photocurrent flowing from the second semiconductor layer 2042 to the first semiconductor layer 2041, which is equivalent to a change in the resistance of the photodiode, thereby causing a change in the current in the circuits. Thus, the display brightness of the display screen may be adjusted according to the change in the current.

At S104, the second semiconductor layer 2042 in the second contact area 203 is processed to form a second contact electrode 2031.

Figure 5:
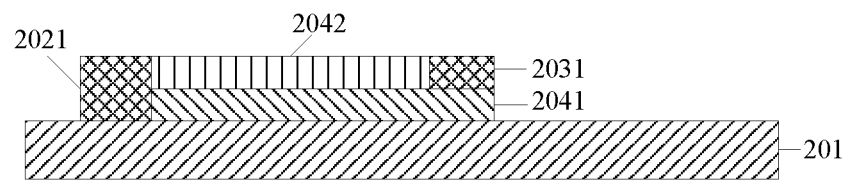

As shown in FIG. 5, a conductorization process is performed on the second semiconductor layer 2042 in the second contact area 203 at the other end of the semiconductor material layer 20, so as to form the second contact electrode 2031. The second contact electrode 2031 may form ohmic contacts with other conductor materials, and serve as the other electrode of the photodiode to be connected to other circuits in the display substrate.

The first semiconductor layer 2041, the second semiconductor layer 2042, the first contact electrode 2021, and the second contact electrode 2031 of the photodiode form a PN junction that is equivalent to a silicon photodiode, and a reverse bias voltage is applied to upper and lower electrodes of the silicon photodiode.

At S105, an interlayer insulating layers is formed on the first contact electrode 2021, the second semiconductor layer 2042, and the second contact electrode 2031.

Figure 6:
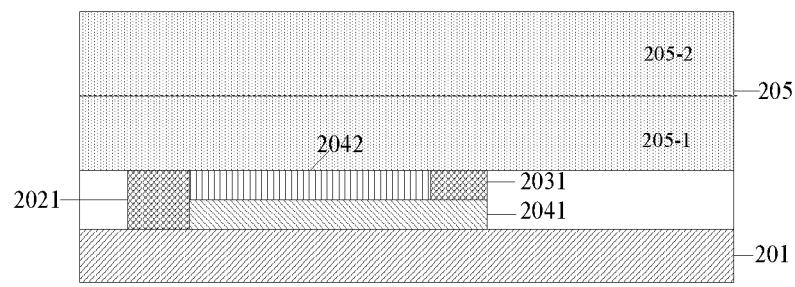

As shown in FIG. 6, the interlayer insulating layers 205 may be formed on the first contact electrode 2021, the second semiconductor layer 2042 in the semiconductor area 204, and the second contact electrode 2031. The interlayer insulating layers 205 may prevent a short circuit inside the photodiode. The interlayer insulating layers 205 include a first interlayer insulating layer 205-1 and a second interlayer insulating layer 205-2.

At S106, a first via 206 and a second via 207 are formed by a patterning process in the interlayer insulating layers 205 (including the first interlayer insulating layer 205-1 and the second interlayer insulating layer 205-2) at positions corresponding to the first contact electrode 2021 and the second contact electrode 2031 respectively.

Figure 7:
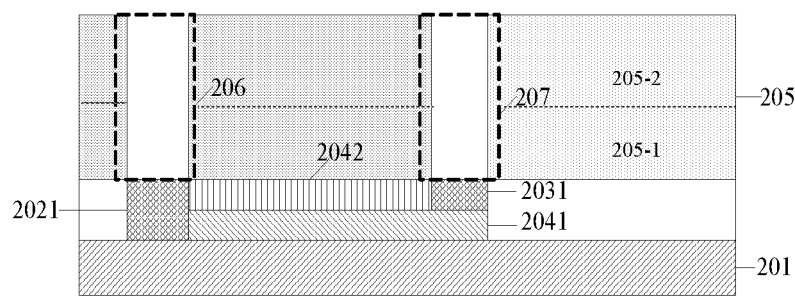

As shown in FIG. 7, an etching process may be performed on the interlayer insulating layers 205 (including the first interlayer insulating layer 205-1 and the second interlayer insulating layer 205-2) at the positions corresponding to the first contact electrode 2021 and the second contact electrode 2031, until the first via 206 that exposes the first contact electrode 2021 and the second via 207 that exposes the second contact electrode 2031 are formed.

At S107, a first connection electrode 208 and a second connection electrode 209 are formed in the interlayer insulating layers 205 (including the first interlayer insulating layer 205-1 and the second interlayer insulating layer 205-2), and the first connection electrode 208 and the second connection electrode 209 are connected to the first contact electrode 2021 and the second contact electrode 2031 through the first via 206 and the second via 207 respectively.

Figure 8:
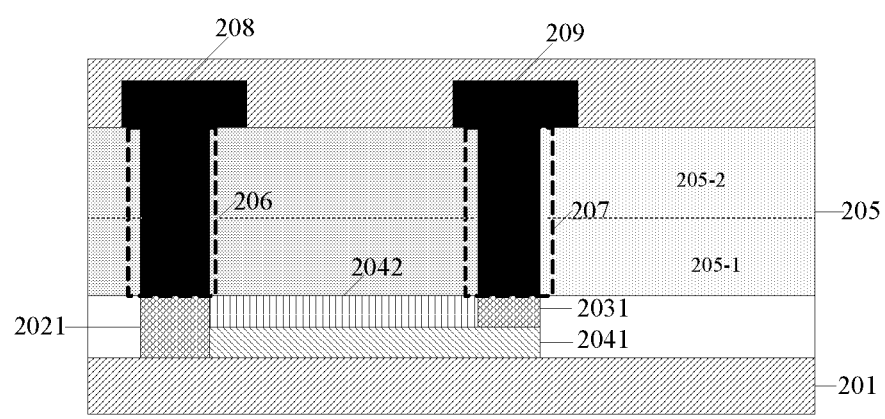
Figure 9:
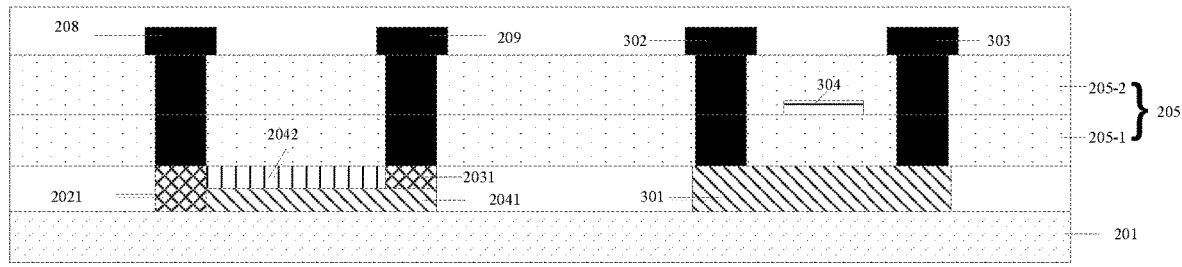
FIG. 9 is a schematic diagram of a display substrate including a photodiode and a thin film transistor of a sub-pixel according to the embodiments of the present disclosure.
Figure 10:
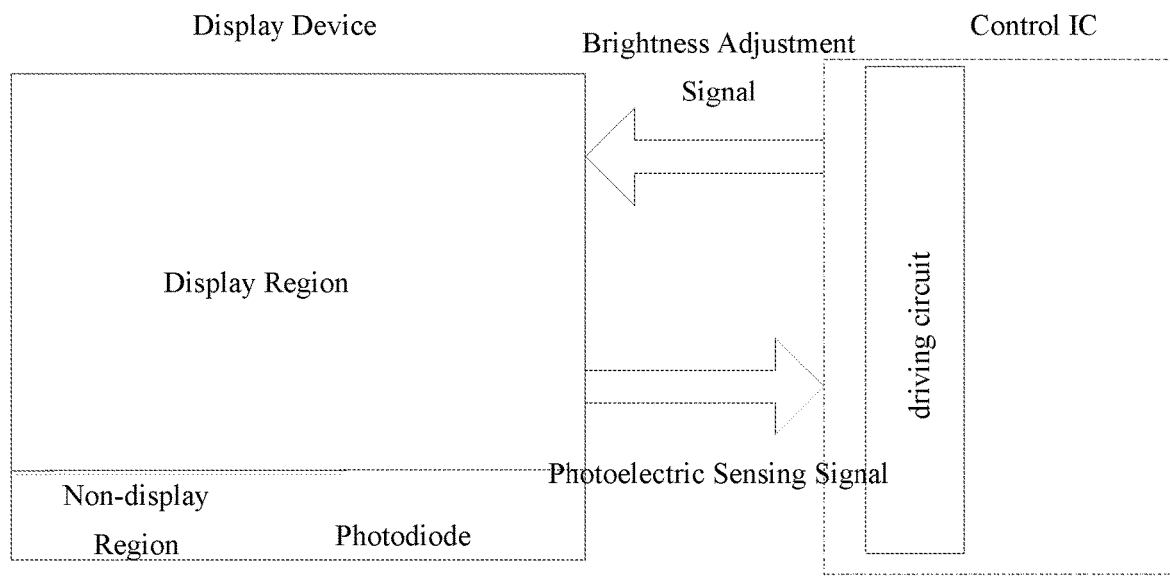
FIG. 10 is a schematic diagram of a display device according to the embodiments of the present disclosure.

As shown in FIG. 8, the first connection electrode 208 and the second connection electrode 209, which are separated from each other, may be formed on the interlayer insulating layers 205 (including the first interlayer insulating layer 205-1 and the second interlayer insulating layer 205-2). The first connection electrode 208 is filled in the first via 206 and is electrically connected to the first contact electrode 2021 through the first via 206. The second connection electrode 209 is filled in the second via 207 and is electrically connected to the second contact electrode 2031 through the second via 207, so as to be easily connected to other circuits in the display substrate. A planarization layer may be further formed on the first connection electrode 208 and the second connection electrode 209, so as to planarize the surfaces thereof.

With the method for manufacturing a photodiode according to the embodiments of the present disclosure, the first semiconductor layer 2041 and the second semiconductor layer 2042, which have opposite polarities, are formed from the semiconductor material layer 20, and the first contact electrode 2021 and the second contact electrode 2031 as two electrodes are connected with other circuits in the display substrate through the first connection electrode 208 and the second connection electrode 209 respectively, so that the photodiode may be integrated into the display substrate, thereby reducing the space occupied by the photodiode as a light sensor, improving the display effect of the display screen, and facilitating the full-screen display.

In one embodiment, the step S101 of forming the semiconductor material layer on the base substrate includes forming the semiconductor material layer on the base substrate with a semiconductor material by a sputtering process.

For example, the semiconductor material layer 20 may be formed on the base substrate 201 from a P-type semiconductor material by a sputtering process. It should be understood that other processes may be used to form the semiconductor material layer 20 in practical application, and the present disclosure is not limited thereto.

In one embodiment, the step S102 of processing the semiconductor material layer in the first contact area 202 to form the first contact electrode 2021 includes: implanting first ions of a first concentration into the semiconductor material layer in the first contact area to form the first contact electrode 2021.

For example, the first ions of the first concentration may be implanted into the semiconductor material layer 20 in the first contact area 202 by means of ion implantation. The concentration of the first ions is high enough to make the first contact area 202 of the semiconductor material layer 20 be heavily doped, so that the first contact area 202 is conductive to easily form ohmic contacts with other conductor materials. In the embodiments of the present disclosure, the first ions have the same polarity as the semiconductor material, that is, the first ions may be P-type ions. Specifically, the first ions may include: Boron (B) ions or Gallium (Ga) ions. The first ions may be doped into the semiconductor material layer 20 in the first contact area 202 by means of high temperature diffusion or by other means. By reasonably controlling the concentration of the first ions, the first contact area 202 may be heavily doped so as to easily form ohmic contacts with other conductor materials.

In one embodiment, the step S103 of processing the portions, which are away from the base substrate, of the semiconductor material layer in the semiconductor area 204 and the second contact area 203, to form the first semiconductor layer 2041 and the second semiconductor layer 2042 that are stacked includes: implanting second ions of a second concentration into the portion of the semiconductor material layer in the semiconductor area 204 and the portion of the semiconductor material layer in the second contact area 203, with the two portions being away from the base substrate, so as to form the first semiconductor layer 2041 and the second semiconductor layer 2042 that are stacked together.

It should be noted that the second ions of the second concentration may be implanted into the portion of the semiconductor material layer in the semiconductor area 204 and the portion of the semiconductor material layer in the second contact area 203, the two portions are away from the base substrate, by means of ion implantation. The second ions are of N-type and have a polarity opposite to that of the semiconductor material. The concentration of the second ions is high enough to neutralize the polarity of the semiconductor material and to change the portion of the semiconductor material layer 20 in the semiconductor area 204 and the portion of the semiconductor material layer 20 in the second contact area 203, with the two portions being away from the base substrate 201, from P-type to N-type, so as to form the second semiconductor layer 2042, that is, an N-type semiconductor layer. However, the polarities of the lower portion of the semiconductor material layer 20 in the semiconductor area 204 and the lower portion of the semiconductor material layer 20 in the second contact area 203 remain unchanged, with the two lower portions being proximal to the base substrate 201, so as to form the first semiconductor layer 2041, that is, a P-type semiconductor layer. In the absence of light irradiation, the photodiode has infinite resistance. When the photodiode is irradiated with light, electron-hole pairs are generated between the P-type semiconductor layer and the N-type semiconductor layer; due to diffusion and a built-in electric field, the electrons and the holes are transported to the N-type semiconductor layer and the P-type semiconductor layer respectively to generate a photocurrent flowing from the N-type semiconductor layer to the P-type semiconductor layer, which is equivalent to a change in the resistance of the photodiode, thereby causing a change in the current in the circuits. Thus, the display brightness of the display screen may be adjusted according to the change in the current.

In one embodiment, the step S104 of processing the second semiconductor layer 2042 in the second contact area 203 to form the second contact electrode 2031 includes: implanting the second ions of a third concentration into the second semiconductor layer 2042 in the second contact area 203 to form the second contact electrode 2031.

It should be noted that the second ions of a certain concentration are continuously implanted into the second contact area 203 after the second semiconductor layer 2042 is formed. The concentration of the second ions is high enough, so that the second contact area 203 of the semiconductor material layer 20 is heavily doped and the second contact area 203 is conductive, so as to easily form ohmic contacts with other conductor materials. In the embodiments of the present disclosure, the second ions have a polarity opposite to that of the semiconductor material, that is, the second ions may be N-type ions. Specifically, the second ions may include: Phosphorus (P) ions or Arsenic (As) ions. It should be understood that the second ions may be doped into the second semiconductor material layer 2042 in the second contact area 203 by means of high temperature diffusion or by other means. By reasonably controlling the concentration of the second ions, the second contact area 203 may be heavily doped so as to easily form ohmic contacts with other conductor materials.

In one embodiment, a method for manufacturing a display substrate is provided, and includes: forming the above photodiode in a non-display region. In addition, the method further includes forming a thin film transistor of a sub-pixel in a display region, and specifically includes: forming an active layer 301 of the thin film transistor on the base substrate 201; forming the first interlayer insulating layer 205-1, which covers the active layer 301, the first contact electrode 2021, the second semiconductor layer 2042 and the second contact electrode 2031, on a side of the active layer 301 away from the base substrate 201; forming a gate electrode 304 on a side of the first interlayer insulating layer 205-1 away from the base substrate 201; forming the second interlayer insulating layer 205-2 on a side of the gate electrode 304 away from the base substrate 201; and forming a source electrode 302 and a drain electrode 303 in the first interlayer insulating layer 205-1 and the second interlayer insulating layer 205-2, such that the source electrode 302 and the drain electrode 303 are electrically connected to two ends of the active layer 301 respectively.

In one embodiment, a method for manufacturing a display substrate is provided, and the display substrate includes a display region and a non-display region. The manufacturing method includes: forming the first semiconductor layer 2041, the second semiconductor layer 2042, the first contact electrode 2021 and the second contact electrode 2031 in the non-display region, and forming the active layer 301 of the thin film transistor in the display region; forming the first interlayer insulating layer 205-1 on a side of the second semiconductor layer 2042, the first contact electrode 2021, the second contact electrode 2031 and the active layer 301 away from the base substrate 201; forming the gate electrode 304 on a side of the first interlayer insulating layer 205-1 away from the base substrate 201 in the display region; forming the second interlayer insulating layer 205-2, which covers the gate electrode 304 in the display region and the first interlayer insulating layer 205-1 in the non-display region, on a side of the gate electrode 304 away from the base substrate 201; forming the source electrode 302 and the drain electrode 303 in the first interlayer insulating layer 205-1 and the second interlayer insulating layer 205-2 in the display region, such that the source electrode 302 and the drain electrode 303 are connected to two ends of the active layer 301 respectively; and forming the first connection electrode 208 and the second connection electrode 209 in the first interlayer insulating layer 205-1 and the second interlayer insulating layer 205-2 in the non-display region, such that the first connection electrode 208 and the second connection electrode 209 are connected to the first contact electrode 2021 and the second contact electrode 2031 respectively.

Based on the same inventive concept, the embodiments of the present disclosure provide a photodiode. As shown in FIG. 8, the photodiode includes: the base substrate 201, the first semiconductor layer 2041, the second semiconductor layer 2042, the first contact electrode 2021, the second contact electrode 2031, the interlayer insulating layers 205 including the first interlayer insulating layer 205-1 and the second interlayer insulating layer 205-2, the first via 206, the second via 207, the first connection electrode 208, and the second connection electrode 209.

The first semiconductor layer 2041 is located on the base substrate 201; the first contact electrode 2021 is located at one end of the first semiconductor layer 2041, an orthographic projection of the first contact electrode 2021 on the base substrate 201 is in direct contact with and does not overlap an orthographic projection of the first semiconductor layer 2041 on the base substrate 201. The orthographic projection of the first contact electrode 2021 on the base substrate 201 is in direct contact with and does not overlap an orthographic projection of the second semiconductor layer 2042 on the base substrate 201. A height of the first contact electrode 2021 along a direction perpendicular to the base substrate 201 is equal to a sum of a height of the first semiconductor layer 2041 along the direction perpendicular to the base substrate 201 and a height of the second semiconductor layer 2042 along the direction perpendicular to the base substrate 201. The second semiconductor layer 2042 is located on the first semiconductor layer 2041; and the second contact electrode 2031 is located at the other end of the second semiconductor layer 2042 away from the first contact electrode 2021. An orthographic projection of the second contact electrode 2031 on the base substrate 201 overlaps the orthographic projection of the first semiconductor layer 2041 on the base substrate 201. The orthographic projection of the second contact electrode 2031 on the base substrate 201 is in direct contact with and does not overlap the orthographic projection of the second semiconductor layer 2042 on the base substrate 201. A height of the second contact electrode 2031 along the direction perpendicular to the base substrate 201 is equal to that of the second semiconductor layer 2042 along the direction perpendicular to the base substrate 201.

The first interlayer insulating layer 205-1 and the second interlayer insulating layer 205-2 cover the first contact electrode 2021, the second semiconductor layer 2042 and the second contact electrode 2031. The first via 206 penetrates through the interlayer insulating layers 205 and exposes the first contact electrode 2021, and the second via 207 penetrates through the interlayer insulating layers 205 and exposes the second contact electrode 2031. The first connection electrode 208 is located on the interlayer insulating layers 205 and is electrically connected to the first contact electrode 2021 through the first via 206, and the second connection electrode 209 is located on the interlayer insulating layers 205 and is electrically connected to the second contact electrode 2031 through the second via 207. A planarization layer covers the interlayer insulating layers 205, the first connection electrode 208 and the second connection electrode 209.

It should be understood that the principle of the photodiode according to the embodiments of the present disclosure is the same as that of the method for manufacturing the photodiode according to the above embodiments, and thus will not be repeated here.

An embodiment of the present disclosure provides a display substrate, including the photodiode provided according to the above embodiments. The display substrate has a display region, and a non-display region provided with the photodiode. The photodiode does not block the display region of the display substrate while sensing the ambient light, thereby avoiding influencing the display effect.

The display substrate further includes a thin film transistor of a sub-pixel. The thin film transistor includes: the active layer 301 located on the base substrate 201; the first interlayer insulating layer 205-1 located on a side of the active layer 301 away from the base substrate; the gate electrode 304 located on a side of the first interlayer insulating layer 205-1 away from the base substrate 201; the second interlayer insulating layer 205-2 located on a side of the gate electrode 304 away from the base substrate 201; and the source electrode 302 and the drain electrode 303 that penetrate through the first interlayer insulating layer 205-1 and the second interlayer insulating layer 205-2 and are electrically connected to two ends of the active layer 301 respectively.

Based on the same inventive concept, an embodiment of the present disclosure provides a display device, including the display substrate provided according to the above embodiments. The display device further includes a driving chip. The driving chip receives a photoelectric sensing signal from the photodiode of the display substrate; and inputs a brightness adjustment signal to the sub-pixel according to the photoelectric sensing signal of the photodiode, so as to achieve automatic adjustment of display brightness. The driving chip may be connected to the sub-pixel and the photodiode in a conventional connection way in the related art, which will not be repeated here.

The photodiode provided by the present disclosure is integrated into the display device, and the manufacturing process of the photodiode is compatible with the manufacturing process of an AMOLED display device.

It should be understood that the above embodiments are merely exemplary embodiments employed to illustrate the principles of the present disclosure, and the present disclosure is not limited thereto. Various changes and modifications can be made by those skilled in the art without departing from the spirit and essence of the present disclosure, and should be considered to fall within the scope of the present disclosure.

What is claimed is:

1. A photodiode, comprising:
    a first semiconductor layer on a base substrate in a non-display region of a display substrate;
    a first contact electrode at one end of the first semiconductor layer;
    a second semiconductor layer on a side of the first semiconductor layer away from the base substrate; and
    a second contact electrode on the side of the first semiconductor layer away from the base substrate and at the other end of the second semiconductor layer away from the first contact electrode, wherein
    an orthographic projection of the first contact electrode on the base substrate is in direct contact with and does not overlap an orthographic projection of the first semiconductor layer on the base substrate,
    the orthographic projection of the first contact electrode on the base substrate is in direct contact with and does not overlap an orthographic projection of the second semiconductor layer on the base substrate, and
    a height of the first contact electrode along a direction perpendicular to the base substrate is equal to a sum of a height of the first semiconductor layer along the direction perpendicular to the base substrate and a height of the second semiconductor layer along the direction perpendicular to the base substrate.

2. The photodiode of claim 1, further comprising:
    a first interlayer insulating layer on a side of the first contact electrode, the second contact electrode and the second semiconductor layer away from the base substrate;
    a second interlayer insulating layer on a side of the first interlayer insulating layer away from the base substrate; and
    a first connection electrode and a second connection electrode penetrating through the first and second interlayer insulating layers and being connected to the first and second contact electrodes respectively.

3. The photodiode of claim 1, wherein
an orthographic projection of the second contact electrode on the base substrate overlaps the orthographic projection of the first semiconductor layer on the base substrate,
the orthographic projection of the second contact electrode on the base substrate is in direct contact with and does not overlap the orthographic projection of the second semiconductor layer on the base substrate, and
a height of the second contact electrode along the direction perpendicular to the base substrate is equal to a height of the second semiconductor layer along the direction perpendicular to the base substrate.

4. The photodiode of claim 3, wherein
a thickness of the first semiconductor layer is equal to a thickness of the second semiconductor layer.

5. A display substrate, comprising:
the photodiode of claim 2; and
a thin film transistor of a sub-pixel located in a display region of the display substrate, the thin film transistor comprising:
an active layer on the base substrate in the display region;
the first interlayer insulating layer on a side of the active layer away from the base substrate;
a gate electrode on a side of the first interlayer insulating layer away from the base substrate;
the second interlayer insulating layer on a side of the gate electrode away from the base substrate; and
a source electrode and a drain electrode penetrating through the first and second interlayer insulating layers and electrically connected to two ends of the active layer respectively.

6. A display device, comprising:
the display substrate of claim 5; and
a driving chip configured to input a brightness adjustment signal to the sub-pixel according to an electrical signal from the photodiode in the display substrate.

* * * * *